United States Patent [19]

Murata et al.

[11] 4,363,134

[45] Dec. 7, 1982

[54] CHANNEL SELECTION APPARATUS

[75] Inventors: Toshinori Murata; Shigeo Matsuura, both of Yokohama, Japan

[73] Assignee: Hitachi, Ltd., Tokyo, Japan

[21] Appl. No.: 168,733

[22] Filed: Jul. 14, 1980

[30] Foreign Application Priority Data

Jul. 14, 1979 [JP] Japan .................................. 54-88691

[51] Int. Cl.³ ............................................. H04B 1/16
[52] U.S. Cl. ................................... 455/161; 455/167; 455/258; 455/264
[58] Field of Search ............... 455/161, 164, 167, 179, 455/196, 197, 255, 257, 258, 263, 264, 336, 337; 334/11, 18

[56] References Cited

U.S. PATENT DOCUMENTS

| | | | |
|---|---|---|---|
| 3,798,553 | 3/1974 | Sakamoto | 455/167 |
| 3,864,636 | 2/1975 | Fukuda | 455/164 |
| 3,893,032 | 7/1975 | Sakamoto | 455/167 |
| 4,004,233 | 1/1977 | Sakamoto | 455/164 |
| 4,232,397 | 11/1980 | Murata et al. | 455/161 |
| 4,270,219 | 5/1981 | Murata et al. | 455/161 |

FOREIGN PATENT DOCUMENTS 54-104221  8/1979  Japan .................................. 455/161

*Primary Examiner*—Tommy P. Chin
*Attorney, Agent, or Firm*—Antonelli, Terry and Wands

[57] ABSTRACT

In a channel selection apparatus for a television receiver or FM radio receiver having an electronic tuner, a local oscillation signal of the electronic tuner having a local oscillator which is swept by a voltage sweeping circuit is passed through a comb-shape filter having a SAW element. Peak outputs from the comb-shape filter are counted by a presettable counter. When the count reaches a preset count, the sweeping operation of the voltage sweeping circuit is stopped to select a desired channel. A portion of the peaks of the comb-shape filter characteristic is attenuated and a gap appearing at the attenuated portion is detected by the frequency sweep of the local oscillation signal with a change in time interval. The detection signal is compared to discriminate the first pulse necessary for the channel selection.

9 Claims, 15 Drawing Figures

CHANNEL SELECTION APPARATUS

FIELD OF THE INVENTION

The present invention relates to a channel selection apparatus for a television receiver or FM tuner having an electronic tuner, and more particularly to a channel selection apparatus having a comb-shape filter comprising a SAW element for effecting error-free channel selection.

The background and preferred embodiments of the present invention will now be described with reference to the accompanying drawings.

DESCRIPTION OF THE PRIOR ART

The prior art is first explained for better understanding of the present invention.

As an element whose reactance is controllable by an electric control signal, such as a variable capacitance diode which has recently become available, an electronic tuner which uses such an element as a component of a tuning circuit to enable tuning by the electric control signal has been widely used.

In such an electronic tuner, the tuning operation is accomplished by merely changing the control voltage. Accordingly, it is easy to automatically select an electromagnetic wave from a desired broadcasting station to select that channel.

Many types of automatic channel selection apparatus have been known. One example is an automatic channel selection apparatus which uses a surface acoustic wave element (SAW element).

Figure 1:
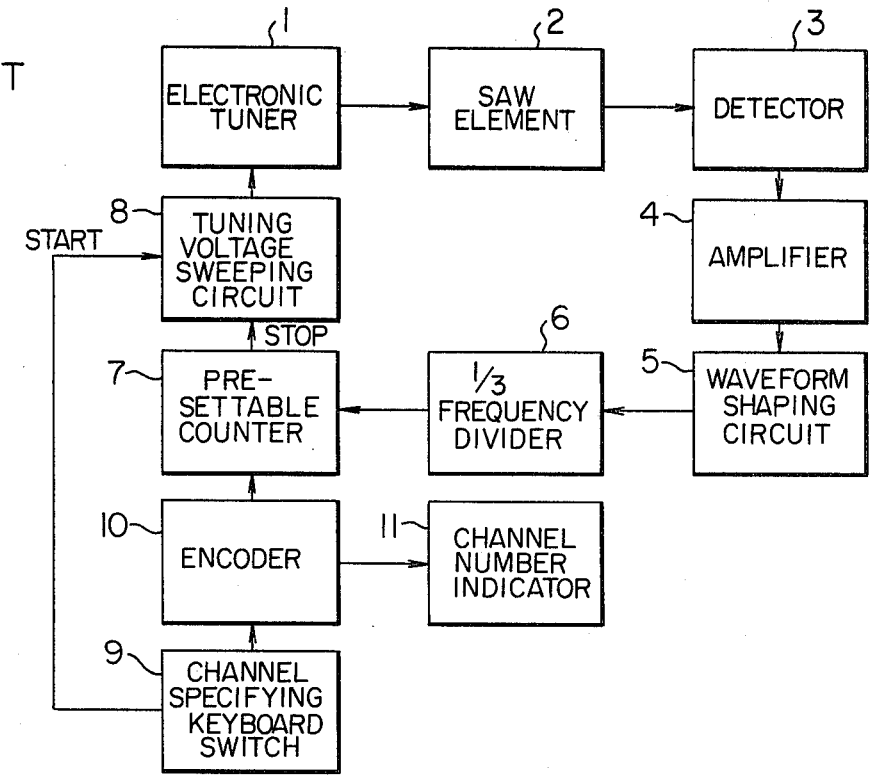
FIG. 1 is a block diagram of one example of a conventional channel selection apparatus which uses a surface acoustic wave element (SAW element).

FIG. 1 shows an example of a prior art automatic channel selection apparatus which uses the SAW element.

In FIG. 1, numeral denotes an electronic tuner, 2 a SAW element, 3 a detector, 4 an amplifier, 5 a waveform shaping circuit, 6 a ⅛ frequency divider, 7 a presettable counter, 8 a tuning voltage sweeping circuit, 9 a channel specifying keyboard switch, 10 an encoder and 11 a channel number indicator.

Figure 2:
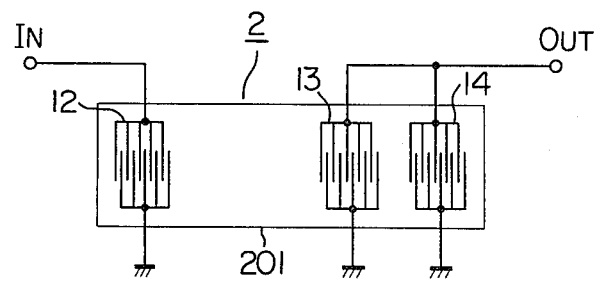
FIG. 2 shows a schematic view of a general structure of the SAW element.

Before explaining the operation of the prior art automatic channel selection apparatus, the SAW element 2 is explained first. As shown in FIG. 2, the SAW element 2 comprises a substrate 201 of piezoelectric material such as $LiNbO_3$ or $LiTaO_3$ on which an input electrode 12 and a pair of output electrodes 13 and 14 spaced from the input electrode 12 by predetermined distances, respectively, are arranged. The electrodes 12, 13 and 14 may be interdigital. As a locally oscillated signal is applied to the input electrode 12 from an input terminal IN, it is converted to a surface acoustic wave by the piezoelectric effect of the substrate 201, which wave propagates on the surface of the substrate 201 to the output electrodes 13 and 14 where it is reconverted to an electric signal by the piezoelectric effect, which signal appears at an output terminal OUT.

Since the output electrodes 13 and 14 are spaced from each other by a predetermined distance and differently spaced from the input electrode 12, the signal from the output electrode 13 and the signal from the output electrode 14 have phase difference therebetween due to the difference between propagation times. The output signal $V_1$ from the output electrode 13 can be expressed by;

$$V_1 = Ae^{j\omega t}$$

where $\omega = 2\pi f$ and f is a frequency, and the output signal $V_2$ from the output electrode 14 can be expressed by;

$$V_2 = Ae^{j\omega(t-\tau)}$$

where $\tau$ is a time required for the surface acoustic wave to propagate from the electrode 13 to the electrode 14.

Since the output electrodes 13 and 14 are connected in parallel, the signal V appearing at the output terminal OUT can be expressed by;

$$V = V_1 + V_2 = Ae^{j\omega t} + Ae^{j\omega(t-\tau)}$$

The amplitude $|V|$ is given by;

$$|V| = A|e^{j\omega t} + e^{j\omega(t-\tau)}| = A\sqrt{2(1 + \cos\omega\tau)}$$

Accordingly, the amplitude $|V|$ is maximum, that is, equal to 2 A when $\omega = 2N\pi/\tau$ or $f = N/\tau$, where N is an integer, and it is minimum, that is, equal to zero when $\omega=(2N+1)\pi/\tau$ or $f=(N+\frac{1}{2})/\tau$.

A frequency interval $\Delta f$ between adjacent maximum points is given by;

$$\Delta f = \frac{N+1}{\tau} - \frac{N}{\tau} = \frac{1}{\tau}$$

Since $\tau$ is constant for a given SAW element, $\Delta f$ is also constant.

On the other hand, the frequencies of the local oscillation signals of the tuners for the television broadcasting channels in Japan are divided into the following three bands:
VHF low band (Channels 1 to 3)
150–162 MHz
VHF high band (Channel 4 to 12)
230–276 MHz
UHF band (Channel 13–62)
530–824 MHz FIG. 3 shows frequency characteristics of a comb-shape filter in which the SAW elements 2 each has a pass band 4 MHz extending from the lower end of the corresponding band and $\tau$ of $\frac{1}{2}$ $\mu$second.

Figure 4:
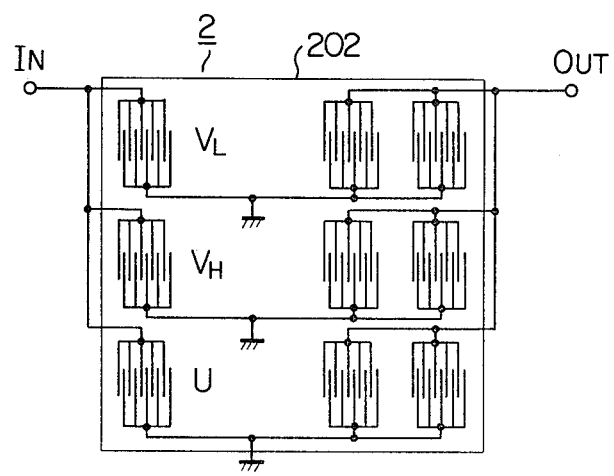
FIG. 4 shows a schematic view of a structure of the SAW element used in the conventional channel selection apparatus.

Since it is difficult to attain the comb-shape filters for the respective bands by a single SAW element, three sets of electrodes may be arranged on the single substrate 202 as shown in FIG. 4 and the input electrodes and the output electrodes are connected in parallel respectively. They need not be connected through switches but may be simply connected in parallel because the respective SAW elements do not have overlapped pass band and they exhibit substantially indefinite impedances to the signal frequencies outside the pass bands and hence they donnot affect to each other.

Figure 3:
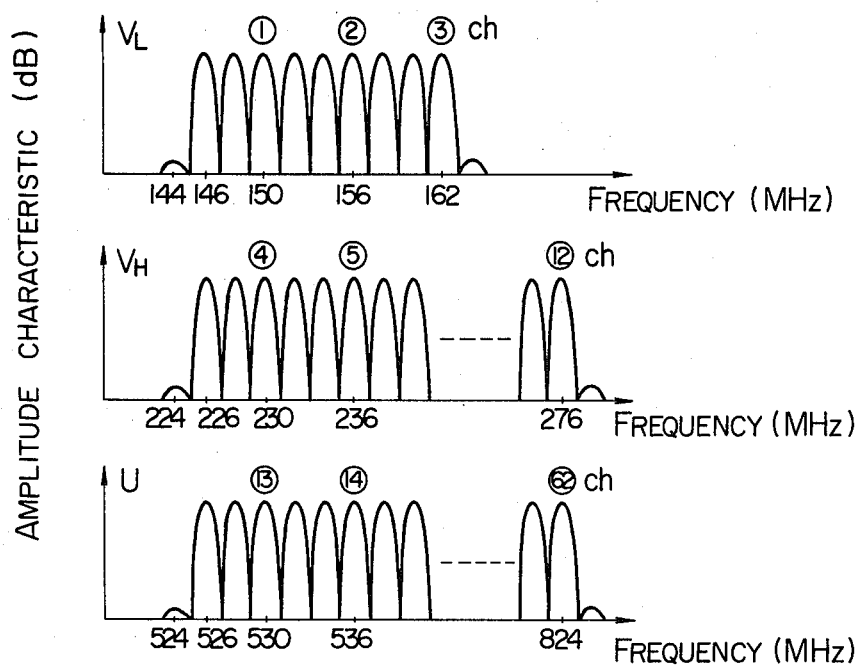
FIG. 3 shows a frequency characteristic of the SAW element required for the channel selection apparatus.

Bearing the fact that the SAW elements 2 have the frequency characteristics as shown in FIG. 3 in mind, the operation of the prior art channel selection apparatus shown in FIG. 1 is now explained. The numerals ①, ②, ... ⑥② show the peak characteristics of the comb-shape filter which appear for the local oscillation signal frequencies for the corresponding channels.

Referring to FIG. 1, in order to select or switch a desired channel to be received, the keyboard switch 9 is actuated to enter the channel number to be selected. The channel number to be selected, entered by the keyboard switch 9 is binary-coded by the encoder 10 and then preset to the presettable counter 7. The channel number is also applied to the channel number indicator 11 which may be a seven-segment numeric indicator having LED's, to display the channel number to be selected.

When the key of the keyboard switch 9 is operated to enter the channel number, the keyboard switch 9 generates a start signal, which initiates the sweeping operation of the tuning voltage of the tuning voltage sweeping circuit 8. As a result, the local oscillation signal frequency of the electronic tuner 1 gradually rises and hence the tuning frequency rises. The local oscillation signal is also applied to the SAW element 2. As seen from the characteristic shown in FIG. 3, as the frequency rises to reach 146 MHz, the local oscillation signal appears at the output of the SAW element 2 and disappears at 147 MHz, and it again appears at 148 MHz. In this manner, the local oscillation signal appears at the output of the SAW element 2 at every 2 MHz increment. When the output of the SAW element 2 is detected by the detector 3, the level of the detected signal significantly changes as the frequency rises. When the member of times of reaching the peak level is counted, it represents the number of times of 2 MHz increment after the local oscillation signal frequency has reached 146 MHz.

Thus, when the output of the detector 3 is amplified by the amplifier 4 to a predetermined level, shaped by the waveform shaping circuit 5 and frequency-divided by three by the $\frac{1}{3}$ frequency divider 6, the number of pulses appearing at the output of the $\frac{1}{3}$ frequency divider 6 correponds to the channel number of the television broadcast. Referring to FIG. 3, as the local oscillation signal frequency of the tuner 1 gradually increases by the sweeping voltage from the voltage sweeping circuit 8 and finally reaches 146 MHz, the pulse appears at every 2 MHz increment and those pulses are fed to the $\frac{1}{3}$ frequency divider 6 through the detector 3, the amplifier 4 and the waveform shaping circuit 5. Thus, a pulse appears at the output of the $\frac{1}{3}$ frequency divider 6 when the local oscillation signal frequency reaches 150 MHz, that is, a condition at which the channel ① television broadcasting signal is tuned, and another pulse appears when the frequency reaches 156 MHz or when the channel ② is tuned. In a similar manner, a pulse appears at each of 126 MHz, 230 MHz, ... 276 MHz, 530 MHz, ... 824 MHz. It is thus seen that the total number of the pulses generated represents the channel number.

The pulses appearing at the output of the $\frac{1}{3}$ frequency divider 6 are applied to a count-down input of the presettable counter 7 to count down the preset channel number of the presettable counter which was initially preset by the keyboard switch 9 through the encoder 10. When the content of the presettable counter 7 reaches zero, a stop signal is generated, which is applied to the tuning voltage sweeping circuit 8 to stop the sweeping operation of the voltage sweeping circuit 8. The voltage at that moment is held to select the desired channel.

Practically, it is difficult to cover from the VHF low band to the VHF high band as well as the UHF band by a one-band channel selection operation of the electronic tuner 1. Accordingly, it is divided into three bands, VHF low band ($V_L$), VHF high band ($V_H$) and UHF band (U). The local oscillation signal changes in the range of 100–170 MHz for the VHF low band, 200–300 MHz for the VHF high band, and 500–1000 MHz for the UHF band.

Accordingly, the presettable counter 7 is preset by the keyboard switch 9 through the encoder 10 such that it generates the stop signal for the VHF low band when the preset initial count has been counted down to zero, generates the stop signal for the VHF high band when the initial count has been counted down to three, and generate the stop signal for the UHF band when the initial count has been counted down to twelve.

This is because the local oscillation signal covers only the frequency within the respective band and hence, as seen from FIG. 3, the channel ④ is represented when pulse is applied to the presettable counter 7 at 230 MHz for the VHF high band, and the channel ⑬ is represented when a pulse is applied at 530 MHz for the UHF band. As a result, the numbers three and twelve have to be preset to compensate for the shortage of the number of pulses.

According to the automatic channel selection apparatus of this system, the tuning is updated each time the channel selection operation is effected. Accordingly, it can select the channels without adjustment for longer time period than a system in which the tuning voltages are preset and one of the preset tuning voltages is selected and fed to the electronic tuner each time the channel is to be selected. Therefore, this system has been recently adapted widely.

However, in this prior art automatic channel selection apparatus using the SAW element, if the output level of the local oscillation signal of the local oscillator of the electronic tuner 1 varies or the characteristic of the detector 3 varies due to the variation of the power supply voltage, the change of surrounding temperature or the aging of the components, the first one of the pulses appearing at the output of the waveform shaping circuit 5 does not necessarily correspond to the first peak point of the comb-shape characteristic of the SAW element 2. As a result, the count may not correspond to the channel number.

Referring to the frequency characteristic of the SAW element 2 shown in FIG. 3, when the local oscillation signal frequency gradually rises by the voltage sweep for the VHF low band, the first pulse would normally appear at the output of the waveform shaping circuit 5 at 146 MHz. However, if the above change or variation occurs, the first pulse may appear at 144 MHz, or it may not appear even at 146 MHz and eventually appear at the next peak point, 148 MHz. Accordingly, the channel number does not coincide with the total number of the pulses appearing at the output of the ⅓ frequency divider 6 and the channel may be erroneously selected.

SUMMARY OF THE INVENTION

It is an object of the present invention to eliminate the difficulties encountered in the prior art and provide an automatic channel selection apparatus which can provide the first pulse at the correct peak point of the comb-shape filter characteristic without being affected by the level change of the local oscillation signal.

In order to attain the above object, in accordance with the present invention, a portion of the peak points of the comb-shape characteristic of the comb-shape filter using the SAW element is attenuated so that the first pulse is generated at the peak point next to the attenuated peak point.

DESCRIPTION OF THE PREFERRED EMBODIMENTS

Referring to FIGS. 5 to 9, the preferred embodiments of the present invention will now be explained.

FIG. 5 shows a characteristic of a comb-shape filter having a SAW element 2A used in the present embodiment. It is designed for the VHF low band. It exhibits a smoothly attenuated characteristic at the 146 MHz peak point at which the first pulse is to be generated, and the 144 MHz peak point immediately before the 146 MHz peak point has been attenuated to zero as shown by a broken line.

More particularly, in order to cause the 146 MHz peak to be recognized as the peak point for the first pulse, the peak preceding to the 146 MHz peak, e.g. the 144 MHz peak which is immediately before the 146 MHz peak, is significantly attenuated. Thus, by detecting where the peak is eliminated, the normal count can be started from the next peak, that is, the starting point of the peak can be recognized.

Figure 5A:
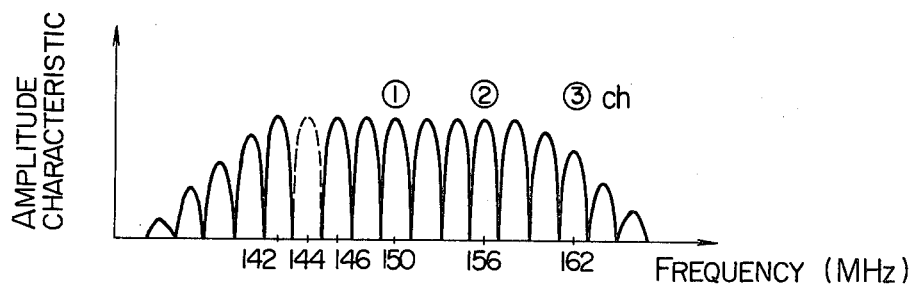
FIG. 5A shows a frequency characteristic of a SAW element used in one embodiment of the present invention.
Figure 5B:
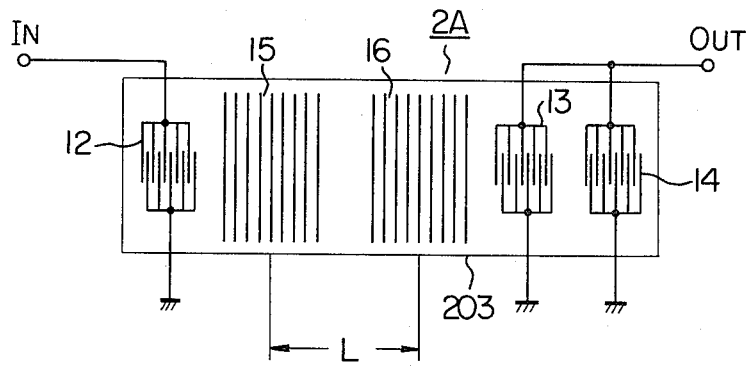
FIG. 5B shows a schematic view of a structure of the SAW element used in the embodiment of the present invention.

The frequency characteristic shown can be attained by the SAW element 2A as shown in FIG. 5B, in which the input electrode 12 and the output electrodes 13 and 14 are interdigital as in the case of FIG. 2. They are of normal structure in which the lengths of the crossing portions are equal to each other to provide smooth attenuation characteristics on both sides of the pass band.

Numerals 15 and 16 denote reflection electrodes by which the 144 MHz peak is attenuated as shown in FIG. 5A. The filter resonates when the following relation is met:

$$L = (\lambda/2) \cdot n$$

where L is a center-to-center distance L between the electrodes 15 and 16, n is an interger and $\lambda$ is a wavelength of the surface acoustic wave, and it attenuates the surface acoustic wave having the wavelength $\lambda$. That is, a transfer impedance between the input electrode 12 and the output electrodes 13, 14 becomes infinite to reflect the surface acoustic wave so that it does not reach the output electrodes 13, 14.

The frequency f of the input signal corresponding to the surface acoustic wave having the wavelength $\lambda$ is given by;

$$f = (n/2L) \cdot v$$

where v is a propagation speed of the surface acoustic wave. Since the sharpness of the resonance is determined by the number N of the paired reflection electrodes 15 and 16, the comb-shape filter having the characteristic as shown in FIG. 5A can be provided by determining the distance L such that the frequency f is equal to 144 MHz and determining the number N of the paired reflection electrodes 15 and 16 so that the sharpness of resonance is such that only one peak point is attenuated.

Figure 5C:
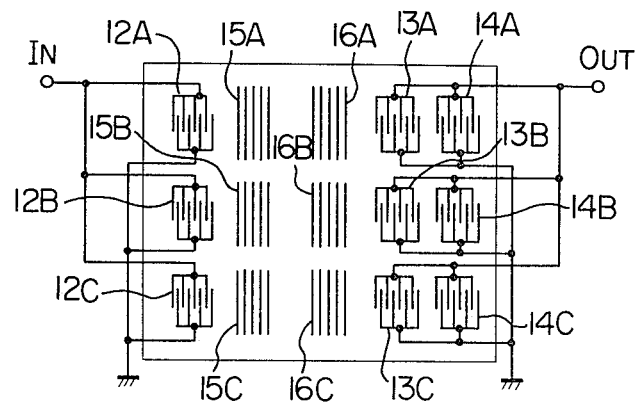
FIG. 5C shows a construction of an interdigital filter in which a plurality of SAW elements shown in FIG. 5B are arranged in parallel.

FIG. 5C shows a construction of a comb-shape filter having a plurality of parallel SAW elements each shown in FIG. 5B.

In FIG. 5C, the SAW elements for the VHF low band ($V_L$), VHF high band ($V_H$) and UHF band (U) are connected in parallel on a common substrate. More particularly, input electrodes 12A, 12B and 12C of the SAW elements 2A are connected in parallel, and output electrodes 13A, 13B, 13C and 14A, 14B, 14C, respectively, are connected in parallel.

One embodiment of the automatic channel selection apparatus of the present invention which uses the SAW elements 2A shown in FIGS. 5A to 5C is now explained.

Figure 6:
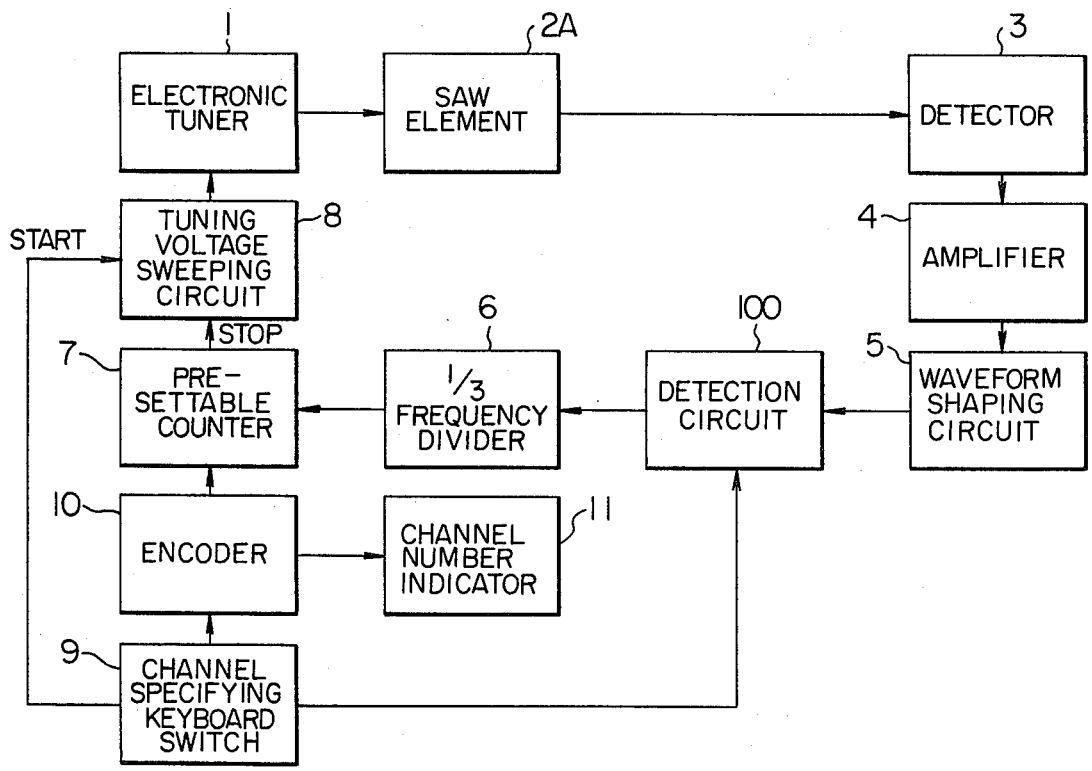
FIG. 6 is a block diagram showing one embodiment of the channel selection apparatus of the present invention which uses the SAW element and a detection device.

FIG. 6 shows a block diagram of one embodiment of the channel selection apparatus of the present invention. It differs from the prior art automatic channel selection apparatus shown in FIG. 1 in that it uses the SAW element 2A shown in FIG. 5B in place of the SAW element 2 shown in FIG. 1 and a detection circuit 100 for detecting an attenuation point of the local oscillation signal from the comb-shape filter is additionally provided between the waveform shaping circuit 5 and the ⅓ frequency divider 6.

Figure 7:
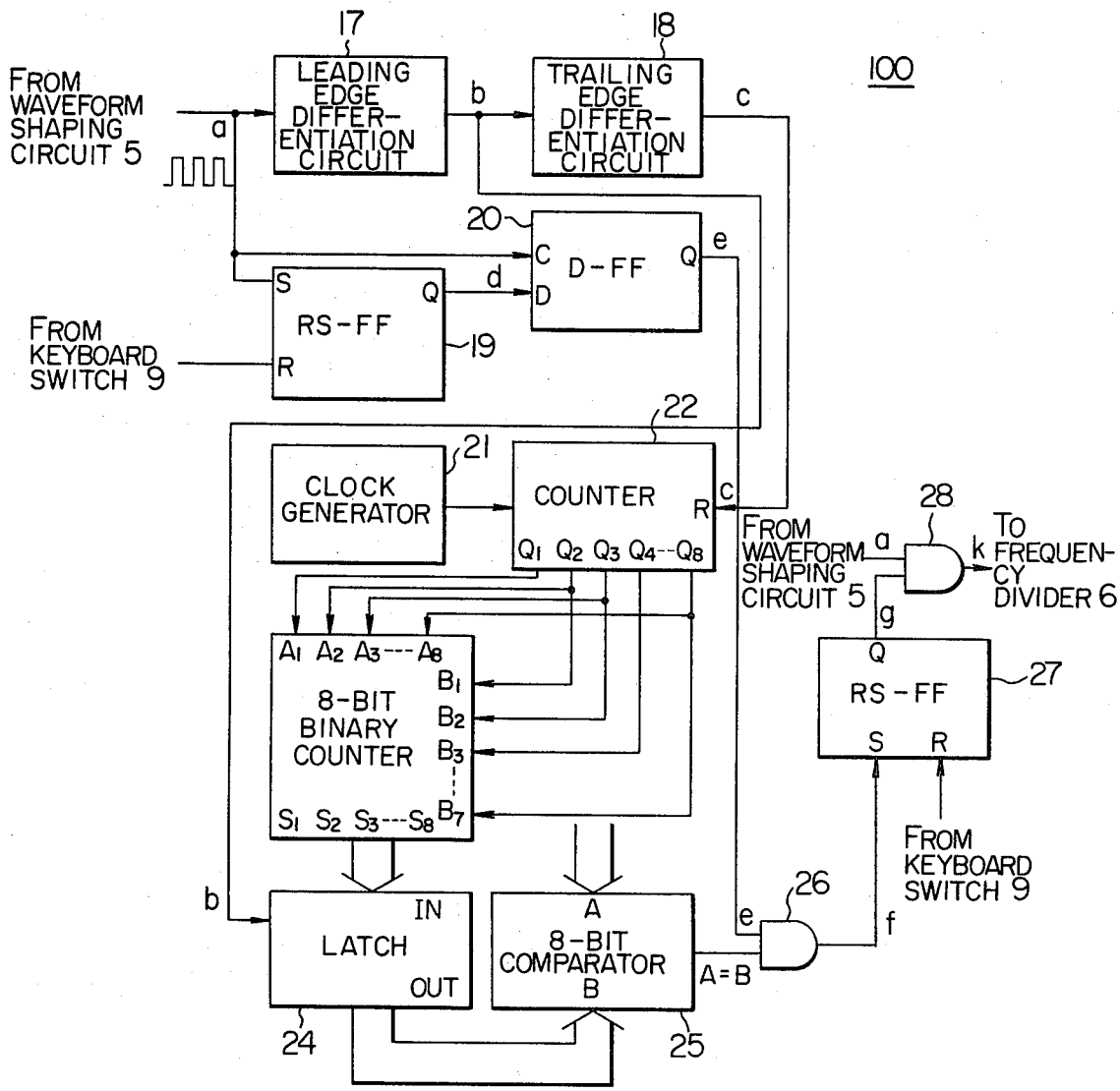
FIG. 7 is a block diagram of the detection device shown in FIG. 6 which is a major unit of the channel selection apparatus.

FIG. 7 shows a block diagram of the detection circuit 100 for detecting the attenuation point of the local oscillation signal. FIGS. 8(a) through (h) show operational waveforms of the detection circuit 100 shown in FIG. 7.

In FIG. 7, numeral 17 denotes a leading edge differentiation circuit for shaping pulse, 18 a trailing edge differentiation circuit, 19 an RS flip-flop, 20 a D flip-flop, 21 a clock generator, 22 a counter, 23 an 8-bit binary counter, 24 a latch circuit, 25 an 8-bit comparator, 27 an RS flip-flop, 26 and 28 AND gates. In the following description, the flip-flops are all designated by FF.

The operation is as follows.

The pulse from the waveform shaping circuit 5 shown in FIG. 6 is applied to the input of the differentiation circuit 17, the S-input of the RS-FF 19 and the C-input of the D-FF 20. Since the SAW element 2A has the characteristic as shown in FIG. 5A, the pulses shown in FIG. 8(a) are sequentially supplied during the channel selection operation. When this pulse train a is applied, the leading edge differentiation circuit 17 produces a pulse train b of narrow pulse width (see FIG. 8(b)), which is then applied to the trailing edge differentiation circuit 18 which in turn produces a pulse train c of narrow pulse width (see FIG. 8(c)).

The RS-FF 19 has been reset by a pulse applied during the channel selection operation at the R-input from the keyboard switch 9 shown in FIG. 6. It is set when the first pulse of the pulse train a which corresponds to the 138 MHz peak (see FIG. 8(a)) is applied to the S-input to produce a signal waveform d (FIG. 8(d)) at the Q-output, which signal is applied to the D-input of the D-FF 20. Since the pulse train a is applied to the C-input (clock input) of the D-FF 20, the D-FF 20 produces a signal waveform e (FIG. 8(e)) at the Q-output at the leading or rising edge of the pulse of the pulse train a which comes after the application of the signal d to the D-input, that is, the pulse corresponding to the 140 MHz peak. When the pulse corresponding to the 138 MHz peak is applied, the signal d has not yet been applied to the D-input of the D-FF 20 by the operational delay of the RS-FF 19 and hence the D-FF 20 does not produce the Q-output in the time period $T_1$ shown in FIG. 8(a).

On the other hand, the counter 22 counts up the output of the clock pulse generator 21 which generates clock pulses of shorter period than the pulse train a from the waveform shaping circuit 5 and it is reset by the pulse train c which is generated slightly after the leading or rising edge of the input pulse train a to restart the count-up operation. The 8-bit outputs $Q_8$-$Q_1$ of the counter 22 are directly applied to one set of inputs $A_8$-$A_1$ of the adder 23 while the outputs $Q_8$-$Q_2$ of the counter 22 are applied to the other set of inputs $B_7$-$B_1$ of the adder 23 and logical "0" is always applied to the $B_8$ input of the adder 23. As a result, the sum outputs $S_8$-$S_1$ of the adder 23 produce the output value which is approximately 1.5 times as large as the content $Q_8$-$Q_1$ of the counter 22. ($Q_8$ of the outputs $Q_8$-$Q_1$ of the counter 22 is the MSB (Most Significant Bit)).

Thus, if $Q_8$-$Q_1$ is equal to 10000000,
then, $A_8$-$A_1$ = 10000000 (128 in decimal notation)
$B_8$-$B_1$ = 01000000 (64 in decimal notation)
$S_8$-$S_1$ = 11000000 (192 in decimal notation),
and if $Q_8$-$Q_1$ is equal to 01110001,
then, $A_8$-$A_1$ = 01110001 (113 in decimal notation)
$B_8$-$B_1$ = 00111000 (56 in decimal notation)
$S_8$-$S_1$ = 10101001 (169 in decimal notation).
Thus, $S_8$-$S_1$ is always approximately 1.5 times as large as $Q_8$-$Q_1$.

The outputs $S_8$-$S_1$ of the adder 23 are applied to the latch circuit 24 which reads in those outputs each time the pulse b from the leading edge differentiation circuit 17 is applied.

The 8-bit comparator 25 receives the count output of the counter 22 at the input A and the latched output from the latch circuit 24 which was read in from the adder 23 by the pulse b, at the input B. The inputs A and B are compared and an output signal is produced when A = B.

Figure 8:
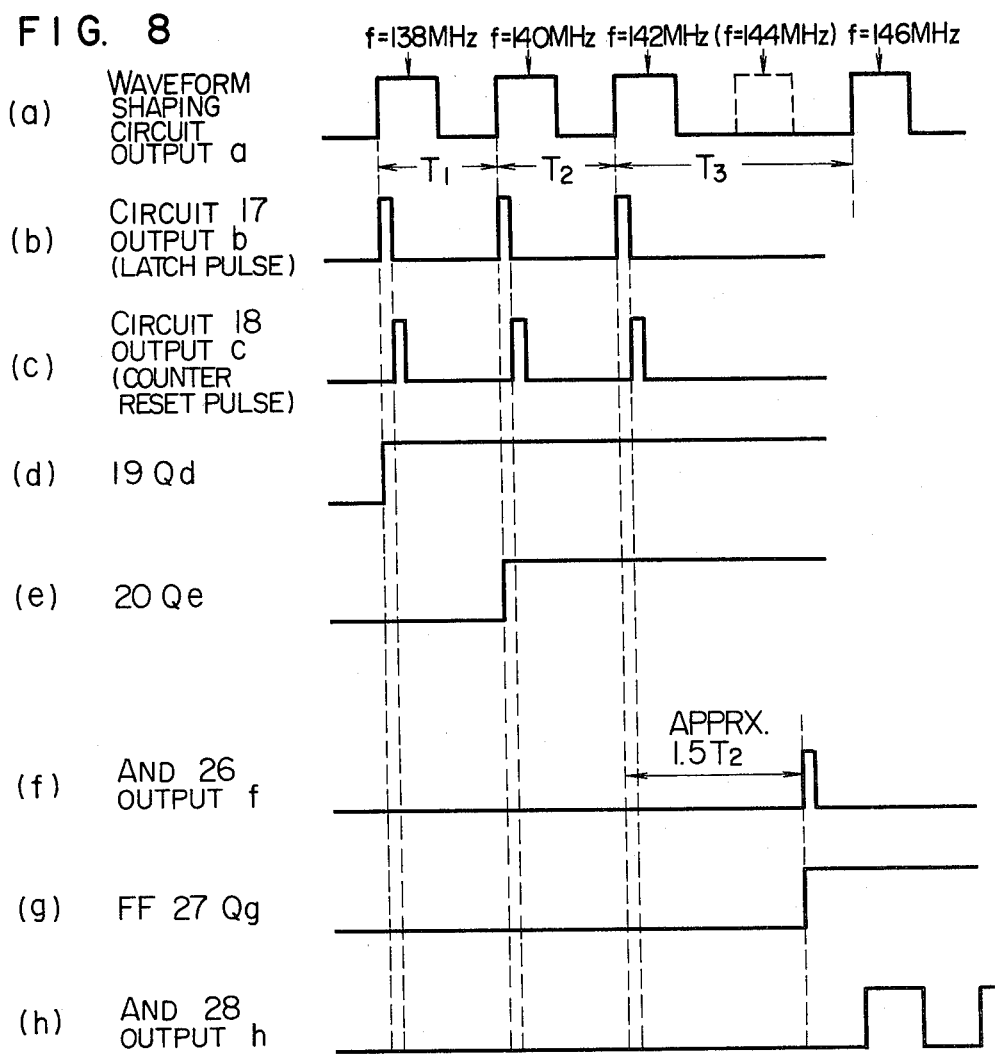
FIGS. 8(a) to (h) show waveforms for explaining the operation of the channel selection apparatus shown in FIG. 7.

Referring to FIG. 8, as the channel selection operation starts and the local oscillation signal frequency rises by the voltage sweep until the pulse train a is produced, the pulse b is generated at the rising edge of the pulse a corresponding to the 138 MHz peak, and then the pulse c is generated. Thus, the latch circuit 24 latches the outputs $S_8$-$S_1$ of the adder 23 and the counter 22 is reset.

During the time period $T_1$ from the pulse corresponding to the 138 MHz peak to the next pulse corresponding to the 140 MHz peak, the counter 22 continues to count up the clock pulses from the clock generator 21. The content of the data outputs $S_8$-$S_1$ latched in the latch 24 at this time depends on the content of the counter 22 it had prior to the time period $T_1$. That is, it is indefinite. Accordingly, it may be possible that the comparator 25 produces an equal signal (A = B) as the counter 22 counts up during the time period $T_1$. In that case, however, the gate 26 will not open because the Q-output e of the D-FF 20 is not yet present.

As the time period $T_1$ terminates and the pulse corresponding to the 140 MHz peak rises, the latch circuit 24 reads in and latches the output $S_8$-$S_1$ of the adder 23 in response to the pulse b, which outputs are approximately 1.5 times as high as the content of the counter 22 which was counted up during the time period $T_1$. The counter 22 is then reset by the pulse c and counts up the clock pulses for the time period $T_2$ which terminates at the rise of the next pulse corresponding to the 142 MHz peak. The comparator 25 does not produce the equal signal (A = B) during the time period $T_2$ because the value which is approximately 1.5 times as large as the content of the counter 22 at the end of the time period $T_1$ has been applied to the input B from the latch circuit 24 while the value which is at most equal to the content of the counter 22 at the end of the time period $T_2$ is applied to the input A, and the time periods $T_1$ and $T_2$ are approximately equal to each other. At the beginning of the time period $T_2$, the D-FF 20 produces the Q-output and it is kept in that state.

When the next pulse a which corresponds to the 142 MHz peak rises, the latch circuit 24 responds to the pulse b to read in and latch the data value from the adder 23, which value is approximately 1.5 times as large as the data value which the counter 22 counted up during the time period $T_2$. Then, the counter 22 is reset by the pulse c and it starts new counting operation.

The SAW element 2A shown in FIG. 6 is constructed as shown in FIG. 5B in which the signal corresponding to the 144 MHz peak is attenuated and hence does not appear in the output as shown in FIG. 5A. Accordingly, in the time period $T_3$ following the time period $T_2$, the pulse a corresponding to the 144 MHz peak is eliminated as shown by the broken line. As a result, the counter 22 continues to count up until the pulse corresponding to the 146 MHz peak appears after the termination of the time period $T_3$ which is approximately twice as long as the time period $T_1$ or $T_2$, and the content of the counter 22 reaches almost twice as high as the data value in the time period $T_2$. Thus, as the time period which is approximately 1.5 times as long as the time period $T_2$ has elapsed, the inputs to the comparator 25 meets the condition of A = B and the compare equal output (A = B) is applied to the gate 26. Since the other input of the gate 26 has been receiving the Q-output e of the D-FF 20, the gate 26 produces the pulse f which sets the RS-FF 27. The Q-output of the RS-FF 27 has been "0" because it was reset by the pulse from the keyboard switch 9 (FIG. 6) at the time of the channel selection.

As the RS-FF 27 produces the Q-output g (FIG. 8(g)), one input of the gate 28 assumes "1" so that the gate 28 passes the pulse a from the waveform shaping circuit 5 shown in FIG. 6 to produce a pulse train h (FIG. 8(h)) the first pulse of which corresponds to the pulse a from the waveform shaping circuit 5 corresponding to the 146 MHz peak.

Accordingly, the pulse train h at the output of the gate 28 includes only the pulses which correspond to the peaks at 146 MHz and higher in the comb-shape filter characteristic shown in FIG. 5A. Therefore, unlike the prior art, the erroneous operation due to the change of the pulse corresponding to the first peak in the comb-shape filter characteristic is prevented.

Thereafter, the pulse train h at the output of the gate 28 is applied to the $\frac{1}{3}$ frequency divider 6 of FIG. 6 to effect the channel selection operation.

In accordance with the present embodiment, a portion of the peaks in the comb-shape filter characteristic is attenuated and the gap produced at the attenuated portion is detected as the change of time interval by the frequency sweep of the local oscillation signal, and it is compared to discriminate the first pulse necessary for the channel selection. Accordingly, the channel selection operation is always effected properly.

While one peak in the comb-shape characteristic of the SAW element is eliminated in the embodiment shown above, two or more peaks may be eliminated. For example, when two peaks are eliminated, the time period is approximately three times as long. In this case, the position of the eliminated pulse may be detected when the time period is 1.5 times as long as the immediately preceding time period. It may also be detected when the time period is twice as long as the immediately preceding period. The factor of 1.5 or 2 may be set by appropriately constructing the adder 23.

While the data value of the sum output $S_8$–$S_1$ of the adder 23 is set to be approximately 1.5 times as large as the output data of the counter 22 in the embodiment shown above, it may be selected to any factor so long as it is a multiple which enables the discrimination of the time period $T_3$ which is twice as long as the time period $T_1$ or $T_2$ of FIG. 8(a) and the value is larger than the content of the counter 22 at the end of the time period $T_1$ or $T_2$ and smaller than the content of the counter 22 at the end of the time period $T_3$.

Figure 9:
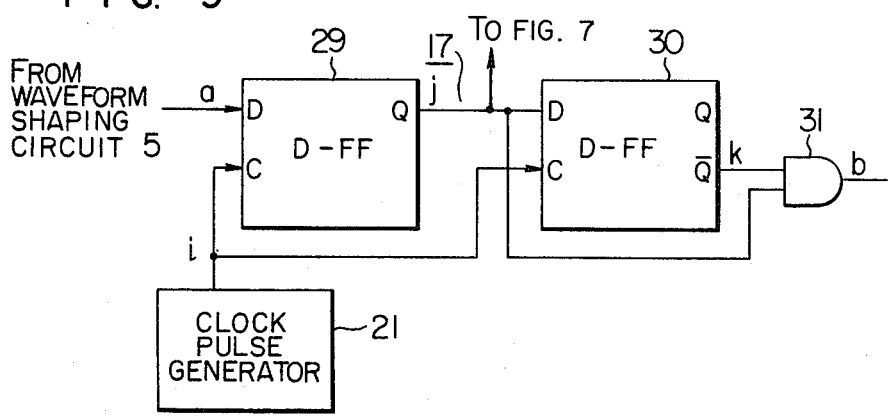
FIG. 9 is a block diagram showing a particular example of a leading edge differentiation circuit shown in FIG. 7.

FIG. 9 shows an embodiment of the leading edge differentiation circuit 17 shown in FIG. 7.

In FIG. 9, numerals 29 and 30 denote D flip-flops (FF), 31 denotes an AND gate, and 21 denotes the clock pulse generator shown in FIG. 7.

Figure 10:
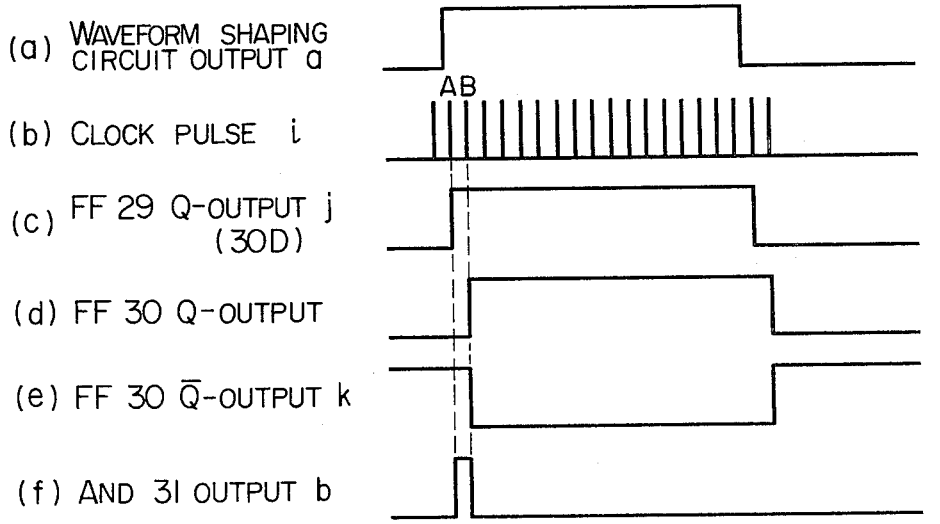
FIGS. 10(a) to (f) show waveforms for explaining the operation of the leading edge differentiation circuit shown in FIG. 9.

The operation of the circuit of FIG. 9 is explained with reference to the waveforms shown in FIG. 10.

The D-FF 29 receives the pulse a (FIG. 10(a)) at the D-input and the clock pulses i (FIG. 10(b)) at the C-input. Thus, it produces at the Q-output the pulse j (FIG. 10(c)) which is synchronized with the clock pulses i. This pulse j can be conveniently used in place of the pulse a shown in FIG. 7. The pulse j may delay one clock interval at most with respect to the pulse a but it does not pose a problem because the clock frequency is high enough.

Of course, the pulse a may be used as it is.

The D-FF 30 receives the pulse j at the D-input and the clock pulses i at the C-input, and produces a signal waveform k as shown in FIG. 10(e) at the $\bar{Q}$-output. This signal output is ANDed with the pulse j from the D-FF 29 at the AND gate 31 to produce the differentiated pulse b (FIG. 10(f)). FIG. 10(d) shows a waveform of the Q-output of the D-FF 30.

In this manner, the differentiation is effected only with the digital circuit. This is advantageous for IC implementation.

The trailing edge differentiation circuit 18 may be constructed similarly.

Figure 11:
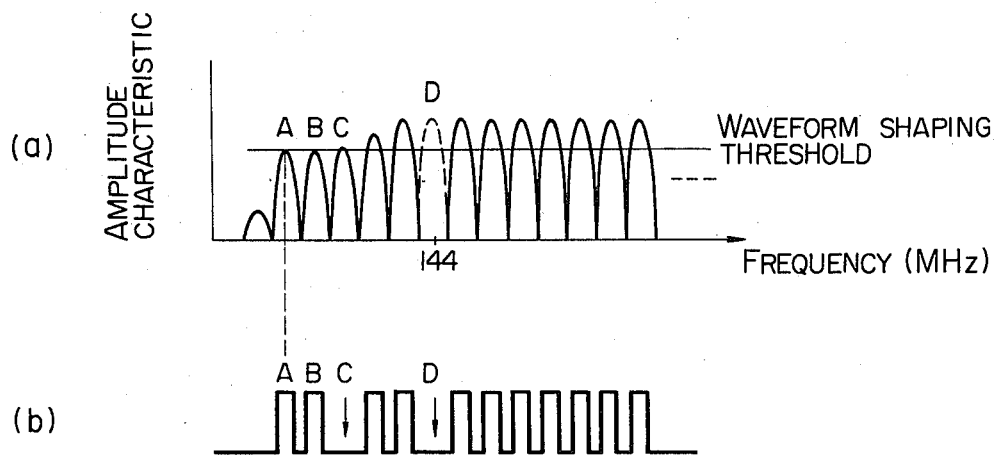
FIG. 11(a) shows a frequency characteristic of the SAW element for explaining the operation under a special condition in one embodiment of the present invention.
FIG. 11(b) shows a waveform of a pulse a shown in FIG. 7 under a special operation condition.

The embodiment shown in FIG. 7, however, may occasionally make erroneous operation depending on conditions, which will be explained with reference to FIG. 11.

FIG. 11(a) shows the characteristic of the SAW element 2A, in which D indicates the attenuated peak point, and A, B and C indicate those peak points which are of lower frequency and have almost uniform amplitude level due to the affect of the ripples of the SAW element 2A, with the amplitude levels thereof having almost reached a threshold of the waveform shaping circuit 5 (FIG. 6).

Under this condition, no problem will occur if all of the peak points A, B and C are detected to produce the pulse a at the time of the channel selection. However, if the level of the local oscillation signal changes due to the short time drift of the local oscillator, the peak point C of the three peaks A, B and C is not detected, that is, it is dropped as shown in FIG. 11(b).

In this case, the supply of the pulses h, which is to start from the point D in the embodiment of FIG. 7, starts from the dropped peak point C and the erroneous operation results in.

Figure 12:
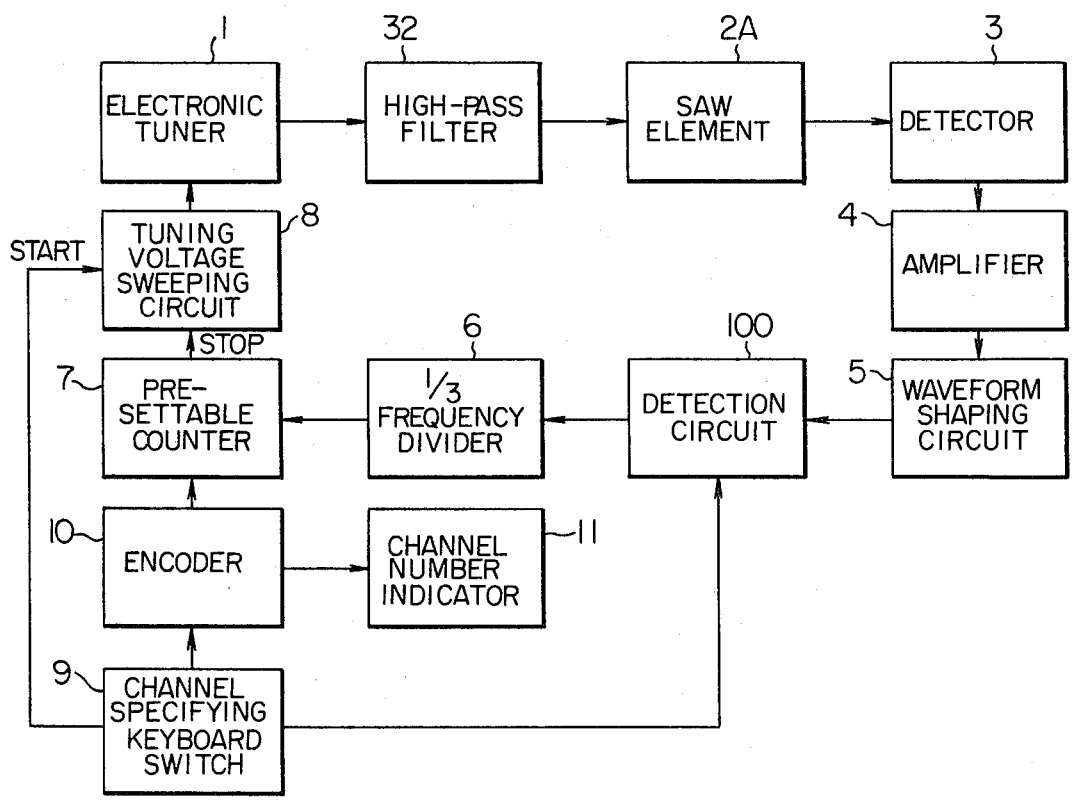
FIGS. 12 and 13 are block diagrams of the channel selection apparatus which improve the pulse waveform shown in FIG. 11(b).
Figure 13:
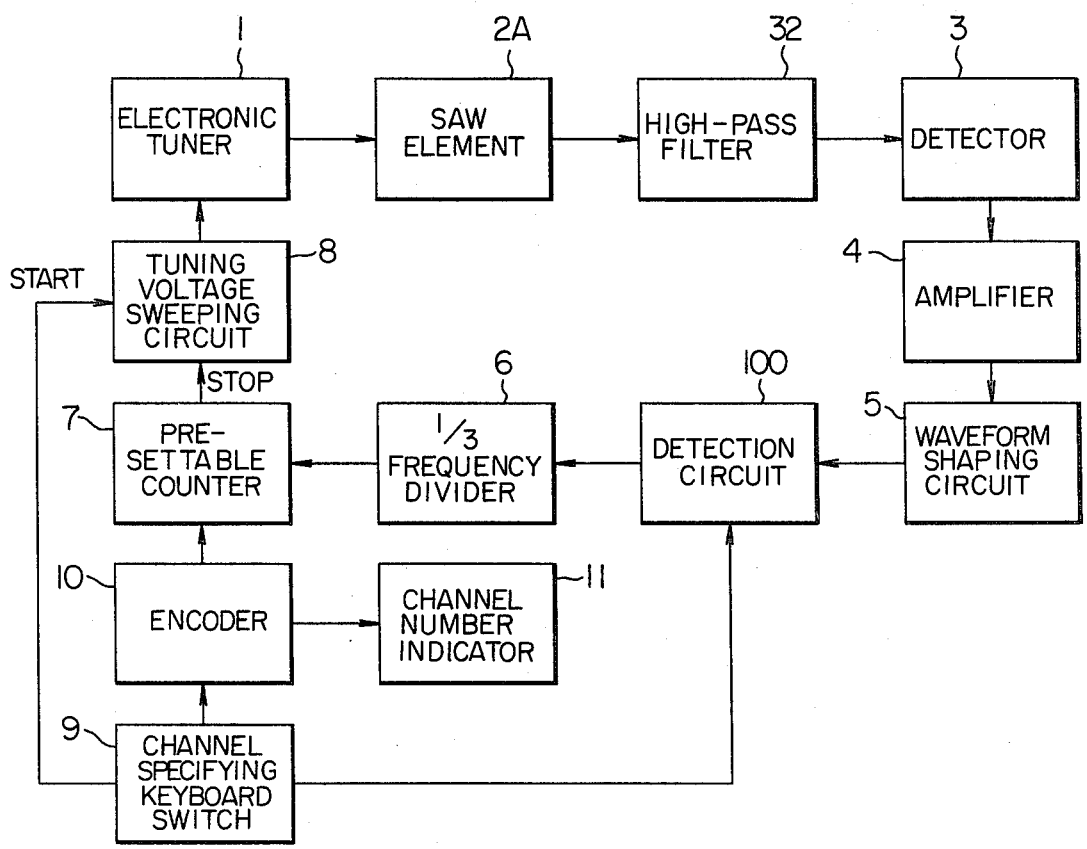

In order to resolve the above problem, in FIG. 12, a high-pass filter 32 is provided between the electronic tuner 1 and the SAW element 2A. The high-pass filter 32 has a cutoff frequency near the eliminated peak point D of the SAW element 2A so that it presents a difference in level with respect to the peak points A to C. It should be understood that the high-pass filter 32 need not be inserted between the electronic tuner 1 and the SAW element 2A but it may be inserted between the SAW element 2A and the detector 3 as shown in FIG. 13.

The present invention is also applicable to the channel number indication apparatus to be described below, in addition to the channel selection apparatus described above.

In a certain type of channel selection apparatus, the tuning voltages to be applied to the electronic tuner are preset in potentiometers (or semi-fixed resistors) or a semiconductor memory and they are selectively read out for application to the electronic tuner to effect the channel selection operation. In such a channel selection apparatus, means is provided to read out the tuning voltage at the time of channel selection operation and then reset the tuning voltages to zero volt. When the newly read tuning voltage is applied, it is applied with a predetermined time constant by a time constant characteristic such as by the parallel connection of a capacitor.

As a result, at the time of channel selection operation, the tuning voltage gradually rises from zero volt and it is swept to the read tuning voltage with the predetermined time constant.

By applying the local oscillation signal to the SAW element 2A using the sweep of the local oscillation signal by the sweep of the tuning voltage, and counting the number of times of the occurrence of output from the detector 3, the channel number of the selected broadcast station can be identified. Thus, by indicating the number by an appropriate indicator, the channel number may be indicated.

When the present invention is applied to indicate the channel number, the channel number can be identified without error so that the channel number is always indicated correctly.

While the SAW element 2A has been shown and described for only the VHF low band as shown in FIG. 5A in the above embodiment, three SAW elements 2A are actually needed as is apparent from the explanation in conjunction with FIGS. 1, 3 and 4, one for each of the VHF low band, VHF high band and UHF band with the peak points eliminated at 144 MHz, 244 MHz and 524 MHz, respectively.

As explained hereinabove, according to the present invention, the channel selection operation is effected correctly without being affected by the changes of the power supply voltage and the temperature and the aging of the components.

Furthermore, since the SAW element in nature exhibits a substantial amount of attenuation for the peak point, the detection of the eliminated peak point is not substantially affected by the variation of level. Accordingly, the present invention assures a very stable operation.

We claim:

1. A channel selection apparatus comprising:
   an electronic tuner having a local oscillator which produces an output signal whose output frequency is variable for controlling the tuning frequency of the tuner;
   a sweeping circuit coupled to said local oscillator for sweeping the frequency of the output signal of said local oscillator;
   a surface acoustic wave comb-shape filter coupled to said local oscillator for receiving the output signal of said local oscillator and producing, when the frequency of the output of said local oscillator is swept from a lower frequency to a higher frequency, an output having a comb-shape output characteristic including a plurality of first output peaks which successively appear at predetermined first frequencies which are substantially equal to first predetermined frequency intervals within a predetermined frequency range of the output of said local oscillator and a second output peak just preceding to a first produced one of said first output peaks at a second frequency spaced by a second frequency interval which is greater than said first frequency interval;
   a first detector coupled to receive the output of the surface acoustic wave comb-shape filter including means for detecting the first and second output peaks of said surface acoustic wave comb-shape filter and means for producing output signals corresponding to the first and second output peaks at said first and second frequency intervals, respectively;
   a presettable counter including means for counting the number of peaks detected by said first detector;
   a second detector coupled to receive the output signals of said first detector including means for discriminating the second frequency interval from the first frequency interval and means for producing an output signal indicative of the detection of said second frequency interval; and
   means coupled to said presettable counter and responsive to the output signal of said second detector for causing said presettable counter to start counting of the output peaks detected by said first detector which occur after detection of said second frequency interval by said second detector.

2. A channel selection apparatus according to claim 1 further comprising a keyboard switch for imparting a channel number to be selected, an encoder for providing a number to be applied to said presettable counter in accordance with said channel number imparted by said keyboard switch and encoding said channel number, and a channel number indicator for indicating said channel number encoded by said encoder.

3. A channel selection apparatus according to claim 1 wherein said surface acoustic wave comb-shaped filter is constructed by a surface acoustic wave element having a substrate of piezoelectric material, an input electrode, an output electrode and a plurality of reflection electrodes arranged between said input and output electrodes.

4. A channel selection apparatus according to claim 3 wherein said surface acoustic wave element comprises a plurality of sets of said input and output electrodes, at least a portion of said input and output electrodes being connected in parallel, respectively.

5. A channel selection apparatus according to claim 1 further comprising a high-pass filter inserted between said electronic tuner and said surface acoustic wave comb-shaped filter.

6. A channel selection apparatus according to claim 1 further comprising a high-pass filter inserted between said surface acoustic wave comb-shaped filter and said detector.

7. A channel selection apparatus according to claim 1 further comprising an encoder for providing a number to be applied to said presettable counter in accordance with a selected channel number and encoding said selected channel number, and a channel number indicator for indicating a channel number encoded by said encoder.

8. A channel selection apparatus according to claim 1 wherein said second detector includes a counter coupled to be reset by an output pulse from said first detector; a binary adder having a first input terminal connected to said counter for directly receiving a first output of said counter, a second input terminal for receiving a second output of said counter, and an output terminal for producing a sum of said first and second counter outputs; a latch circuit connected to said output terminal of said binary adder for reading in and latching the output of said binary adder each time an output pulse from said first detector is applied to said counter; a comparator for comparing outputs of said counter with the latched output of said latch circuit for producing an output pulse when the inputs to said comparator are the same; an RS flip-flop coupled to be set by an output pulse of said comparator and reset by a signal from a keyboard switch for imparting a channel number to be selected; and a first gate for ANDing an output pulse from said RS flip-flop with an output pulse from said first detector.

9. A channel selection apparatus according to claim 8 wherein said second detector further includes a second gate having one input terminal connected to the output terminal of said comparator and an output terminal connected to a set input terminal of said RS flip-flop, a second RS flip-flop coupled to be set by an output pulse from said first detector and reset by a signal from said keyboard switch for imparting the channel number to be selected, and a D flip-flop having a clock input terminal for receiving an output pulse from said first detector, a data input terminal for receiving an output of said second RS flip-flop and an output terminal for applying an output signal to the other input of said second gate.

* * * * *